(12) United States Patent
Xu

(10) Patent No.: US 11,578,742 B2
(45) Date of Patent: Feb. 14, 2023

(54) GALVANOMETER MOTOR MOUNTING STRUCTURE

(71) Applicant: Peijian Xu, Guangzhou (CN)

(72) Inventor: Peijian Xu, Guangzhou (CN)

( * ) Notice: Subject to any disclaimer, the term of this patent is extended or adjusted under 35 U.S.C. 154(b) by 0 days.

(21) Appl. No.: 17/451,649

(22) Filed: Oct. 21, 2021

(65) Prior Publication Data

US 2022/0042531 A1 Feb. 10, 2022

(30) Foreign Application Priority Data

Sep. 3, 2021 (CN) .......................... 202122123792.X

(51) Int. Cl.
*F16B 5/02* (2006.01)
(52) U.S. Cl.
CPC ...................................... *F16B 5/02* (2013.01)
(58) Field of Classification Search
CPC ................................ F16B 5/02; G02B 7/1821
See application file for complete search history.

(56) References Cited

U.S. PATENT DOCUMENTS

| | | | | |
|---|---|---|---|---|
| 5,760,886 A | * | 6/1998 | Miyazaki | G01B 11/026 180/169 |
| 6,181,410 B1 | * | 1/2001 | Ishida | G02B 7/1821 356/28 |
| 2008/0191571 A1 | | 8/2008 | Fukuda et al. | |
| 2009/0218893 A1 | | 9/2009 | Kawai | |
| 2011/0050051 A1 | | 3/2011 | Kondo et al. | |

* cited by examiner

*Primary Examiner* — Jason L Vaughan
*Assistant Examiner* — Amanda Kreiling
(74) *Attorney, Agent, or Firm* — Rumit Ranjit Kanakia

(57) ABSTRACT

Disclosed is a mounting structure for a galvanometer motor. The mounting structure includes a motor apparatus directly mounted on a platform, wherein at least one connection through hole running vertically from a top portion of a housing and extending to a bottom portion of the housing is molded on the housing, and the housing is provided with a connection post, wherein the connection post runs through the connection through hole and is fixedly connected to the platform. In this way, an additional mount is not needed, such that mounting cost is reduced, and mounting is accurate and reliable.

5 Claims, 2 Drawing Sheets

GALVANOMETER MOTOR MOUNTING STRUCTURE

TECHNICAL FIELD

The present disclosure relates to the technical field of galvanometers, and in particular, relates to a mounting structure for a galvanometer motor.

BACKGROUND

A galvanometer system is a high-precision and high-speed servo control system constituted by a drive plate and a high-speed swing motor, which is widely applied in the fields such as laser material machining, biomedical detection, and image and graphics processing. The core component of a high-speed scanning galvanometer system is a galvanometer motor. A high-efficiency and high-quality galvanometer motor is capable of implementing high-speed laser marking.

The conventional galvanometer motor is generally circular and cylindrical. Regardless of a single motor or X/Y/Z axes constituted by more than two motors, a mount with a circular hole needs to be used. A conventional mount is hard to manufacture. In the manufacture process, reverse machining needs to be performed for three to four times. The more the reverse machining processes, the poor the machining precision. With respect to the circular motor, the hole in the mount needs to be greater than the motor so as to accommodate the motor. After the motor is accommodated in the hole, the motor further needs to be clamped, and hence no reference is present. Therefore, during mounting of the conventional circular motor, the reference point needs to be manually adjusted, and the adjustment is laborious and is not sufficiently accurate.

SUMMARY

To overcome the defect in the related art, the present disclosure provides a mounting structure for a galvanometer motor.

To achieve the above object, the present disclosure employs the following technical solution: a mounting structure for a galvanometer motor. The mounting structure includes: a motor apparatus directly mounted on a platform, wherein at least one connection through hole running vertically from a top of a housing and extending to a bottom of the housing is molded on the housing, and the housing is provided with a connection post, wherein the connection post runs through the connection through hole and is fixedly connected to the platform.

Further, a base reference plane, a front reference plane, and a left reference plane and a right reference plane are respectively molded at the bottom portion, a front end portion, and two side end portions of the housing of the motor apparatus, wherein any two adjacent reference planes are perpendicular to each other, the base reference plane is face-to-face in contact with a surface of the platform, a reference anchor is protrusively molded on the surface of the platform, and at least one of the front reference plane, the left reference plane, and the right reference plane is face-to-face in contact with a side wall of the reference anchor.

Further, two diagonally disposed connection through holes are molded in the housing.

Further, the reference anchor is in-line-shaped, and the in-line-shaped reference anchor is face-to-face contactable with any one of the front reference plane, the left reference plane, and the right reference plane.

Further, the reference anchor is L-shaped, and the L-shaped reference anchor is face-to-face contactable with both the front reference plane and the left reference plane simultaneously, or face-to-face contactable with both the front reference plane and the right reference plane simultaneously.

Further, the reference anchor is U-shaped, and the U-shaped reference anchor is face-to-face contactable with all of the front reference plane, the left reference plane, and the right reference plane simultaneously.

The present disclosure achieves the following beneficial effects: (1) No additional mount is needed, such that mounting cost is reduced; (2) the mounting is convenient and simple, which is applicable to various mounting scenarios; (3) the mounting is highly accurate, with small errors.

BRIEF DESCRIPTION OF THE DRAWINGS

To describe embodiments of the present disclosure or the technical solution in the related art, hereinafter, drawings that are to be referred for description of the embodiments or the related art are briefly described. Apparently, the drawings described hereinafter merely illustrate some embodiments of the present disclosure. Persons of ordinary skill in the art may also derive other drawings based on the drawings described herein without any creative effort.

Figure 1:
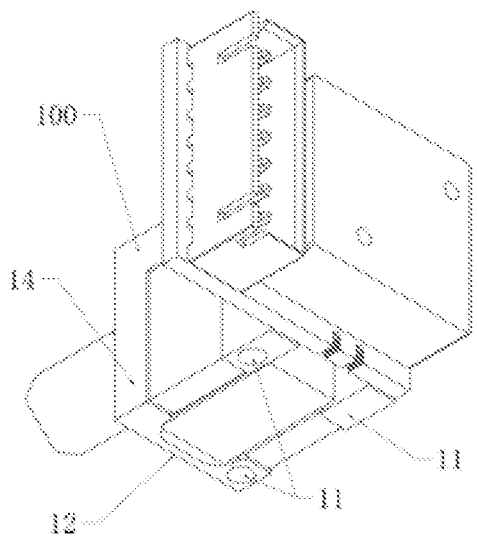
FIG. 1 is a schematic structural view of a motor apparatus.

Reference numerals and denotations thereof: 100—housing, 11—base reference plane, 12—front reference plane, 13—left reference plane, 14—right reference plane, 15—connection through hole, 200—platform, and 21—reference anchor.

DETAILED DESCRIPTION

The technical solutions according to the embodiments of the present disclosure are described in detail clearly and completely hereinafter with reference to the accompanying drawings for the embodiments of the present disclosure. Apparently, the described embodiments are only a portion of embodiments of the present disclosure, but not all the embodiments of the present disclosure. Based on the embodiments of the present disclosure, all other embodiments derived by persons of ordinary skill in the art without any creative efforts shall fall within the protection scope of the present disclosure.

In the description of the present disclosure, it should be understood that the terms "center," "upper," "lower," "left,", "right," "vertical," "horizontal," "inner," "outer," and the like indicate orientations and position relationships which are based on the illustrations in the accompanying drawings, and these terms are merely for ease and brevity of the description, instead of indicating or implying that the devices or elements shall have a particular orientation and shall be structured and operated based on the particular orientation. Accordingly, these terms shall not be construed as limiting the present disclosure. In addition, the terms "first," "second," and "third" are merely for the illustration purpose, and shall not be construed as indicating or implying a relative importance. In the description of the embodiments of the present disclosure, it should be noted that unless otherwise specified and defined, the terms "mounted," "coupled," "connected," and derivative forms thereof shall be understood in a broad sense, which, for example, may be understood as fixed connection, detachable connection or integral connection; may be understood as mechanical connection or electrical connection, or understood as direct connection, indirect connection via an intermediate medium, or communication between the interiors of two elements or interactions between two elements. Persons of ordinary skill in the art may understand the specific meanings of the above terms in the present disclosure according to the actual circumstances and contexts.

Figure 2:
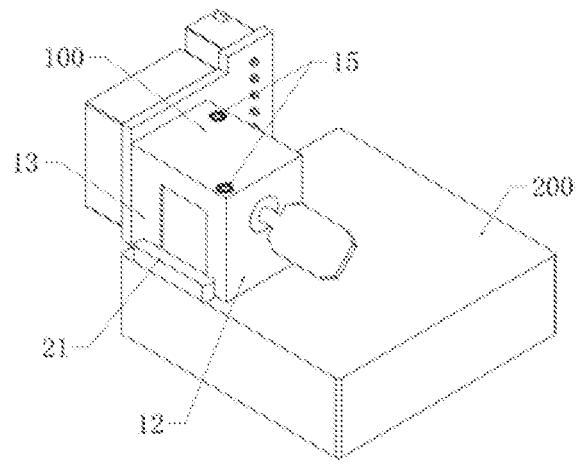
FIGS. 2 to 4 are schematic views of mounting of an in-line-shaped reference anchor.

Referring to FIG. 1 to FIG. 6, a mounting structure for a galvanometer motor according to this embodiment includes a motor apparatus and a platform 200. Since the platform 200 is a precision part configured to bear the motor apparatus, a surface of the platform 200 has high flatness. Referring to FIG. 1 and FIG. 2, specifically, a base reference plane 11, a front reference plane 12, and a left reference plane 13 and a right reference plane 14 are respectively molded at the bottom portion, a front end portion, and two side end portions of a housing 100 of the motor apparatus according to this embodiment, wherein any two adjacent reference planes are perpendicular to each other. That is, the base reference plane 11 and the front reference plane 12 are perpendicular to each other, the base reference plane 11 and the left reference plane 13 are perpendicular to each other, the base reference plane 11 and the right reference plane 14 are perpendicular to each other, the front reference plane 12 and the left reference plane 13 are perpendicular to each other, and the front reference plane 12 and the right reference plane 14 are perpendicular to each other.

In this embodiment, the motor apparatus is directly mounted on the platform 200, with no need of any other mount. In this case, the base reference plane 11 is face-to-face in contact with the surface of the platform 200, such that horizontal mounting is achieved, with no need of additional horizontal correction. In addition, a reference anchor 21 is protrusively molded on the surface of the platform 200, wherein a side wall of the reference anchor 21 is a vertical plane. At least one of the front reference plane 12, the left reference plane 13, and the right reference plane 14 is face-to-face in contact with the side wall of the reference anchor 21. In this way, parallel mounting is achieved, with no need of additional parallel correction.

Further, with reference to a shape of the reference anchor 21, parallel mounting is further illustrated and described.

Figure 3:
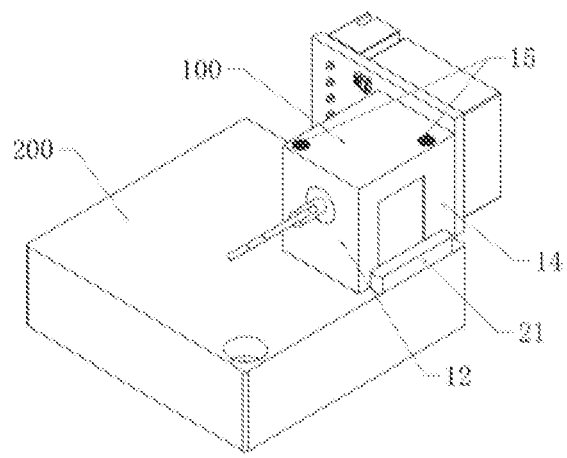
Figure 4:
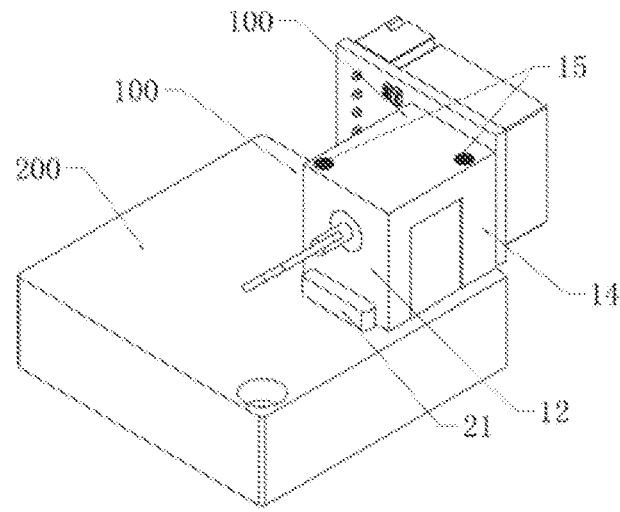

Referring to FIG. 2 to FIG. 4, in a first case: in the case that the reference anchor 21 is in-line-shaped, the in-line-shaped reference anchor 21 is face-to-face contactable with any one of the front reference plane 12, the left reference plane 13, and the right reference plane 14. In this case, parallel positioning of the motor apparatus may be achieved by face-to-face contact between the reference anchor 21 and a single reference plane.

Figure 5:
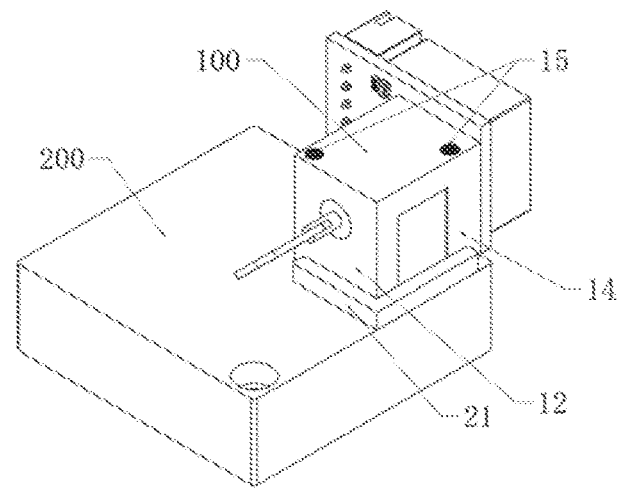
FIG. 5 is a schematic view of mounting of an L-shaped reference anchor.

With reference to FIG. 5, in a second case: in the case that the reference anchor 21 is L-shaped, the L-shaped reference anchor is face-to-face contactable with both the front reference plane 12 and the left reference plane 13 simultaneously, or face-to-face contactable with both the front reference plane 12 and the right reference plane 14 simultaneously. In this case, parallel positioning of the motor apparatus is achieved by face-to-face contact between the reference anchor 21 and two reference planes.

Figure 6:
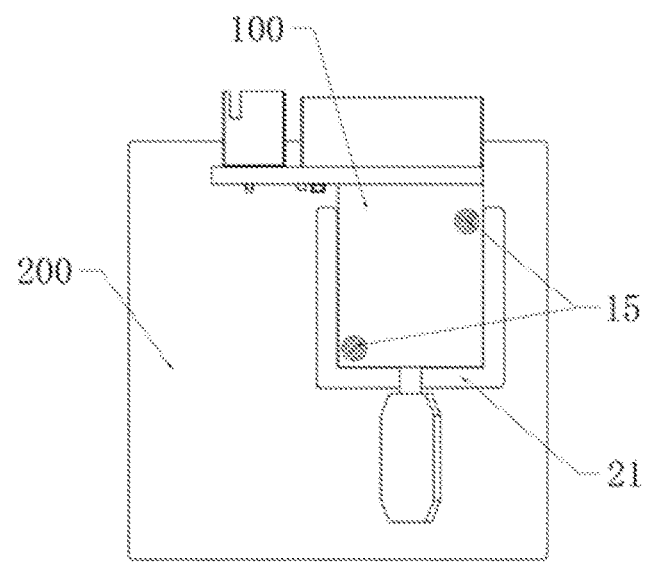
FIG. 6 is a schematic view of mounting of a U-shaped reference anchor.

Referring to FIG. 6, in a third case: in the case that the reference anchor 21 is U-shaped, the U-shaped reference anchor 21 is face-to-face contactable with all of the front reference plane 12, the left reference plane 13, and the right reference plane 14 simultaneously. In this case, parallel positioning of the motor apparatus may be achieved by face-to-face contact between the reference anchor 21 and three reference planes.

With the above configuration, by virtue of the surface of the platform 200 and the reference anchor 21, the positioning of the motor apparatus may be achieved, with no need of additional adjustments or with no need of an additional mount. In this way, the mounting cost and adjustments are reduced, and quick positioning of the motor apparatus is achieved.

In this embodiment, at least one connection through hole (15) running vertically from a top portion of the housing 100 and extending to a bottom portion of the housing 100 is molded on the housing 100. Description is given herein using two connection through holes 15 as an example. Two diagonally disposed connection through holes (15) are molded in the housing (100) according to this embodiment. Each of the connection through holes is provided with a connection post. The connection post runs through the connection through hole 15 and is fixedly connected to the platform 200, such that the motor apparatus is fixedly connected to the platform 200.

Further, the connection post according to this embodiment is preferably a screw.

Accordingly, upon completion of the positioning of the motor apparatus, the motor apparatus is fixedly connected to the platform 200 via the connection post, such that the positioning and mounting of the motor apparatus are achieved.

The above embodiments are used only for illustrating the present disclosure, but are not intended to limit the protection scope of the present disclosure. Various modifications and replacements readily derived by those skilled in the art within technical disclosure of the present disclosure shall fall within the protection scope of the present disclosure. Therefore, the protection scope of the present disclosure is subject to the appended claims.

The invention claimed is:

1. A mounting structure for a galvanometer motor, comprising: a motor apparatus directly mounted on a platform, wherein the motor apparatus comprises a housing, at least one connection through hole running vertically from a top portion of the housing and extending to a bottom portion of the housing is molded on the housing, and the housing is provided with a connection post, wherein the connection post runs through the connection through hole and is fixedly connected to the platform, wherein a base reference plane, a front reference plane, a left reference plane and a right reference plane are respectively molded at the bottom portion, a front end portion, and two side end portions of the housing of the motor apparatus, wherein any two adjacent reference planes are perpendicular to each other, the base reference plane is face-to-face in contact with a surface of the platform, a reference anchor is protrusively molded on the surface of the platform, and at least one of the front reference plane the left reference plane, and the right reference plane is face-to-face in contact with a side wall of the reference anchor.

2. The mounting structure according to claim 1, wherein two diagonally disposed connection through holes are molded in the housing.

3. The mounting structure according to claim 1, wherein the reference anchor is in-line-shaped, and the in-line-shaped reference anchor is face-to-face contactable with any one of the front reference plane, the left reference plane, and the right reference plane.

4. The mounting structure according to claim 1, wherein the reference anchor is L-shaped, and the L-shaped reference anchor is face-to-face contactable with both the front reference plane and the left reference plane simultaneously, or face-to-face contactable with both the front reference plane and the right reference plane simultaneously.

5. The mounting structure according to claim 1, wherein the reference anchor is U-shaped, and the U-shaped reference anchor is face-to-face contactable with all of the front reference plane, the left reference plane, and the right reference plane simultaneously.

* * * * *